US009323688B2

(12) United States Patent
Sutardja

(10) Patent No.: US 9,323,688 B2
(45) Date of Patent: Apr. 26, 2016

(54) METHOD AND APPARATUS FOR ACCESSING DATA STORED IN A STORAGE SYSTEM THAT INCLUDES BOTH A FINAL LEVEL OF CACHE AND A MAIN MEMORY

(71) Applicant: Marvell World Trade Ltd., St. Michael (BB)

(72) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/937,330

(22) Filed: Nov. 10, 2015

(65) Prior Publication Data

US 2016/0062906 A1  Mar. 3, 2016

Related U.S. Application Data

(63) Continuation of application No. 14/710,988, filed on May 13, 2015, now Pat. No. 9,182,915, which is a continuation of application No. 14/519,826, filed on Oct. 21, 2014, now Pat. No. 9,182,915.

(60) Provisional application No. 61/893,662, filed on Oct. 21, 2013, provisional application No. 61/893,675, filed on Oct. 21, 2013, provisional application No. 61/893,683, filed on Oct. 21, 2013, provisional application No. 61/895,049, filed on Oct. 24, 2013.

(51) Int. Cl.
*G06F 12/00* (2006.01)
*G06F 12/08* (2006.01)
(Continued)

(52) U.S. Cl.
CPC ............ *G06F 12/0897* (2013.01); *G06F 3/061* (2013.01); *G06F 3/0638* (2013.01); *G06F 3/0655* (2013.01); *G06F 3/0683* (2013.01); *G06F 12/10* (2013.01); *G06F 12/1027* (2013.01); *G06F 2212/1016* (2013.01); *G06F 2212/20* (2013.01); *G06F 2212/22* (2013.01); *G06F 2212/50* (2013.01); *G06F 2212/60* (2013.01)

(58) Field of Classification Search
None
See application file for complete search history.

(56) References Cited

U.S. PATENT DOCUMENTS 6,978,355 B2   12/2005   Mowery
7,428,617 B2    9/2008   Okawa et al.
(Continued)

FOREIGN PATENT DOCUMENTS

WO   WO-9637844 A1    11/1996
WO   WO-2008055272 A2  5/2008

OTHER PUBLICATIONS

U.S. Appl. No. 61/987,947, Sutardja.
(Continued)

*Primary Examiner* — Brian Peugh

(57) ABSTRACT

A data access system including a storage device and a processor, which includes one or more levels of cache (LOC). In response to data required by the processor not being within the LOC, the processor generates a physical address to be accessed within the storage device in order to retrieve the data. The storage device includes a main memory and a cache module, which is configured as a final level of cache (FLOC) to be accessed by the processor prior to accessing the main memory. The cache module includes a controller that, in response to the data not being cached within the LOC, converts the physical address into a virtual address within the FLOC. The FLOC uses the virtual address to determine whether the data is within the FLOC. If the data is not within the FLOC, the cache module or the processor retrieves the data from the main memory.

16 Claims, 3 Drawing Sheets

(51) Int. Cl.
 G06F 3/06 (2006.01)
 G06F 12/10 (2006.01)

(56) References Cited

U.S. PATENT DOCUMENTS

| | | | |
|---|---|---|---|
| 7,800,856 | B1 | 9/2010 | Bennett et al. |
| 8,688,900 | B2 | 4/2014 | Eleftheriou et al. |
| 2008/0294867 | A1 | 11/2008 | Kimura |
| 2013/0321948 | A1 | 12/2013 | Bandic et al. |
| 2013/0335856 | A1 | 12/2013 | Tanabe et al. |
| 2015/0113214 | A1 | 4/2015 | Sutardja |
| 2015/0242137 | A1 | 8/2015 | Sutardja |

OTHER PUBLICATIONS

U.S. Appl. No. 62/000,657, Huang.
U.S. Appl. No. 62/013,700, Huang.
U.S. Appl. No. 62/013,706, Huang.
U.S. Appl. No. 14/681,485, Huang et al.
U.S. Appl. No. 14/702,078, Sutardja.
U.S. Appl. No. 14/706,335, Huang et al.
U.S. Appl. No. 14/710,988, Sutardja.
"Specification of the Bluetooth System" Master Table of Contents & Compliance Requirements—Covered Core Package version: 4.0; Jun. 30, 2010; 2302 pages.
802.16-2009 IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.
IEEE P802.11 Wireless LANs; Proposed Specification Framework for TGah; Mar. 2012; 13 pages.
IEEE P802.11ac / D2.0; Draft Standard for Information Technology—Telecommunications and information exchange between systems—Local and metropolitan area networks—Specific requirements; Part 11: Wireless LAN Medium Access Control (MAC) and Physical Layer (PHY) specifications; Amendment 4: Enhancements for Very High Throughput for Operation in Bands below 6 GHz; Prepared by the 802.11 Working Group of the 802 Committee; Jan. 2012; 359 pages.
IEEE P802.11ad / D5.0 (Draft Amendment based on IEEE P802.11REVmb D10.0) (Amendment to IEEE 802.11REVmb D10.0 as amended by IEEE 802.11ae D5.0 and IEEE 802.11aa D6.0); Draft Standard for Information Technology—Telecommunications and Information Exchange Between Systems—Local and Metropolitan Area Networks—Specific Requirements; Part 11: Wireless LAN Medium Access Control (MAC) and Physical Layer (PHY) Specifications—Amendment 3: Enhancements for Very High Throughput in the 60 GHz Band; Sponsor IEEE 802.11 Committee of the IEEE Computer Society; Sep. 2011; 601 pages.
IEEE P802.11ah / D1.0 (Amendment to IEEE Std 802.11REVmc / D1.1, IEEE Std 802.11ac / D5.0 and IEEE Std 802.11af / D3.0) Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 6: Sub 1 GHz License Exempt Operation; Prepared by the 802.11 Working Group of the LAN/MAN Standards Committee of the IEEE Computer Society; Oct. 2013; 394 pages.

IEEE P802.11g/D8.2 DRAFT Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher Data Rate Extension in the 2.4 GHz Band; LAN/MAN Standards Committee of the IEEE Computer Society; Apr. 2003; 69 pages.
IEEE P802.20$^{TM}$V14, Draft 802.20 Permanent Document; <System Requirements for IEEE 802.20 Mobile Broadband Wireless Access Systems—Version 14>; Jul. 16, 2004; 24 Pages.
IEEE Std 802.11a-1999 (Supplement to IEEE Std 802.11-1999) Supplement to IEEE Standard for Information technology—Telecommunications and information exchange between systems—Local and metropolitan area networks—Specific requirements—Part11: Wireless LAN Medium Access Control (MAC) and Physical Layer (PHY) specifications: High-Speed Physical Layer in the 5 Ghz Band; LAN/MAN Standards Committee of the IEEE Computer Society; Sep. 16, 1999; 91 pages.
IEEE Std 802.11b; Supplement to IEEE Standard for Information technology—Telecommunications and information exchange between systems—Local and metropolitan area networks—Specific requirements; Part 11: Wireless LAN Medium Access Control (MAC) and Physical Layer (PHY) specifications: Higher-Speed Physical Layer (PHY) Extension in the 2.4 GHz Band; LAN/MAN Standards Committee of the IEEE Computer Society; Sep. 16, 2009; 96 pages.
IEEE Std 802.11b-1999/ Cor 1-2001; IEEE Standard for Information Technology—Telecommunications and information exchange between systems—Local and metropolitan area networks—Specific requirements; Part 11: Wireless LAN Medium Access Control (MAC) and Physical Layer (PHY) specifications; Amendment 2: Higher-Speed Physical Layer (PHY) extension in the 2.4 GHz Band-Corrigendum 1; IEEE Computer Society; Sponsored by the LAN/MAN Standards Committee; Nov. 7, 2001; 23 pages.
IEEE Std 802.20/2008; IEEE Standard for Local and metropolitan area networks; Part 20: Air Interface for Mobile Broadband Wireless Access Systems Supporting Vehicular Mobility—Physical and Media Access Control Layer Specification; IEEE Computer Society; Sponsored by the LAN/MAN Standards Committee; Aug. 29, 2008; 1032 pages.
IEEE Std. 802.11-2012; IEEE Standard for Information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Mar. 29, 2012; 2793 pages.
International Search Report and Written Opinion for PCT Application No. PCT/US2014/061603 mailed Jan. 12, 2015; 12 pages.
Kiran Gunnam et al.; "Multi-Rate Layered Decoder Architecture for Block LDPC Codes of the IEEE 802.11n Wireless Standard"; 2007; pp. 1645-1648.
International Search Report and Written Opinion for PCT Application No. PCT/US2015/028867 mailed Jul. 13, 2015; 9 pages.
Rolf de Vegt; IEEE 802.11ax Selection Procedure (DRAFT); Jul. 2014; 117 pages.
Taeho Kgil and Trevor N. Mudge; "FlashCache: A NAND Flash Memory File Cache for Low Power Web Serviers"; Advanced Computer Architecture Laboratory; The University of Michigan, Ann Arbor, USA; 2006; 13 pages.
Taeho Kgil and Trevor N. Mudge; "FlashCache: A NAND Flash Memory File Cache for Low Power Web Servers"; ResearchGate; Jan. 2006; 11 pages.

METHOD AND APPARATUS FOR ACCESSING DATA STORED IN A STORAGE SYSTEM THAT INCLUDES BOTH A FINAL LEVEL OF CACHE AND A MAIN MEMORY

CROSS-REFERENCE TO RELATED APPLICATIONS

This application is a continuation of U.S. application Ser. No. 14/710,988, filed on May 13, 2015 (now U.S. Pat. No. 9,182,915) which is a continuation of U.S. application Ser. No. 14/519,826, filed on Oct. 21, 2014 which claims the benefit of U.S. Provisional Application No. 61/893,662, filed on Oct. 21, 2013, U.S. Provisional Application No. 61/893,675, filed on Oct. 21, 2013, and U.S. Provisional Application No. 61/893,683, filed on Oct. 21, 2013, and U.S. Provisional Application No. 61/895,049, filed Oct. 24, 2013. The entire disclosures of the applications referenced above are incorporated herein by reference.

FIELD

The present disclosure relates to integrated circuits, and more particularly to cache associated with a system-on-chip.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Devices such as computers, mobile phones, tablets, etc. typically include a system-on-chip (SoC). FIG. 1 shows an example of a device 10 that includes a SoC 12 and one or more dynamic random access memories (DRAMs) 14. The DRAMs 14 can be implemented as one or more integrated circuits that are connected to but separate from the SoC 12. The device 10 can also include one or more storage drives 16 connected to ports 17 of the SoC 12. The storage drives 16 can include flash memory, solid-state drives, hard disk drives, and/or hybrid drives. A hybrid drive includes a solid-state drive with solid-state memory and a hard disk drive with rotating storage media.

The SoC 12 can include one or more image processing devices 20, a system bus 22 and a memory controller 24. Each of the image processing devices 20 can include, for example: a control module 26 with a central processor (or central processing unit (CPU)) 28; a graphics processor (or graphics processing unit (GPU)) 30; a video recorder 32; a camera image signal processor (ISP) 34; an Ethernet interface such as a gigabit (Gb) Ethernet interface 36; a serial interface such as a universal serial bus (USB) interface 38 and a serial advanced technology attachment (SATA) interface 40; and a peripheral component interconnect express (PCIe) interface 42. The image processing devices 20 access the DRAMs 14 via the system bus 22 and the memory controller 24. The DRAMs 14 are used as main memory. For example, one of the image processing devices 20 provides a physical address to the memory controller 24 when accessing a corresponding physical location in one of the DRAMs 14. The image processing devices 20 can also access the storage drives 16 via the system bus 22.

The SoC 12 and/or the memory controller 24 can be connected to the DRAMs 14 via one or more access ports 44 of the SoC 12. The DRAMs 14 store user data, system data, and/or programs. The SoC 12 can execute the programs using first data to generate second data. The first data can be stored in the DRAMs 14 prior to the execution of the programs. The SoC 12 can store the second data in the DRAMs 14 during and/or subsequent to execution of the programs. The DRAMs 14 can have a high-bandwidth interface and low-cost-per-bit memory storage capacity and can handle a wide range of applications.

The SoC 12 includes cache memory, which can include one or more of a level zero (L0) cache, a level one (L1) cache, a level two (L2) cache, or a level three (L3) cache. The L0-L3 caches are arranged on the SoC 12 in close proximity to the corresponding ones of the image processing devices 20. In the example shown, the control module 26 includes the central processor 28 and L1-L3 caches 50. The central processor 28 includes a L0 cache 52. The central processor 28 also includes a memory management unit (MMU) 54, which can control access to the caches 50, 52.

As the level of cache increases, the access latency and the storage capacity of the cache increases. For example, L1 cache typically has less storage capacity than L2 cache and L3 cache. However, L1 cache typically has lower latency than L2 cache and L3 cache.

The caches within the SoC 12 are typically implemented as static random access memories (SRAMs). Because of the close proximity of the caches to the image processing devices 20, the caches can operate at the same clock frequencies as the image processing devices 20. Thus caches exhibit shorter latency periods than the DRAMS 14.

The number and size of the caches in the SoC 12 depends upon the application. For example, a handset (or mobile phone) may not include an L3 cache and can have smaller sized L1 cache and L2 cache than a personal computer. Similarly, the number and size of each of the DRAMs 14 depends on the application. For example, mobile phones currently have 1-4 gigabytes (GB) of DRAM, personal computers currently have 4-16 GB of DRAM, and servers currently have 32 GB-512 GB of DRAM. In general, cost increases as the amount of DRAM increases.

In addition to the cost of DRAM, it is becoming increasingly more difficult to decrease the package size of DRAM for the same amount of storage capacity. Also, as the size and number of DRAMs incorporated in a device increases, the capacitances of the DRAMs increase, the number and/or lengths of conductive elements associated with the DRAMs increase, and buffering associated with the DRAMs increases. In addition, as the capacitances of the DRAMs increase, the operating frequencies of the DRAMs decrease and the latency periods of the DRAMs increase.

During operation, programs and/or data are transferred from the DRAMs 14 to the caches in the SoC 12 as needed. These transfers have higher latency as compared to data exchanges between (i) the caches, and (ii) the corresponding processors and/or image processing devices. For this reason, accesses to the DRAMs 14 are typically avoided due to the longer latency periods.

During boot up, programs can be transferred from the storage drives 16 to the DRAMs 14. For example, the central processor 28 can transfer programs from the storage drive 16 to the DRAMs 14 during the boot up. During the boot up, the central processor 28 can attempt to access data stored in the DRAMs 14. The percentage of hits associated with this access attempt may initially be near or equal to 0%. However, the percentage of hits approach 100% by the end of the boot up.

SUMMARY

A data access system is provided and includes a processor and a final level cache module. The processor is configured to generate a request to access a first physical address. The final level cache module includes a dynamic random access memory (DRAM), a final level cache controller, and a DRAM controller. The final level cache controller is configured to (i) receive the request from the processor, and (ii) convert the first physical address to a first virtual address. The DRAM controller is configured to (i) convert the first virtual address to a second physical address, and (ii) access the DRAM based on the second physical address.

A method for accessing a dynamic random access memory of a final level cache module is provided. The method includes: generating, via a processor, a request to access a first physical address; receiving the request from the processor at a final level cache controller; converting the first physical address to a first virtual address via the final level cache controller; converting the first virtual address to a second physical address via a dynamic random access memory controller; and accessing the dynamic random access memory based on the second physical address.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

At least some of the following examples include final level cache (FLC) modules and storage drives. The FLC modules are used as virtual storage and the storage drives are used as physical storage. Data is first read from or written to the virtual storage prior to reading from or writing to the physical storage. Memory in the FLC modules and storage drives is referred to herein as content addressable memory (CAM). Control modules of the FLC modules control access to the memory in the FLC modules and the storage drives using various CAM techniques described below. The CAM techniques and other disclosed features reduce the required storage capability of the DRAM in a device while maximizing memory access rates and minimizing power consumption. The device may be a network device or a wireless network device. Examples of devices include but are not limited to a computer, a mobile phone, a tablet, a camera, etc. The DRAM in the following examples is generally not used as main memory, but rather is used as virtual memory and/or as a final level of cache.

Figure 1:
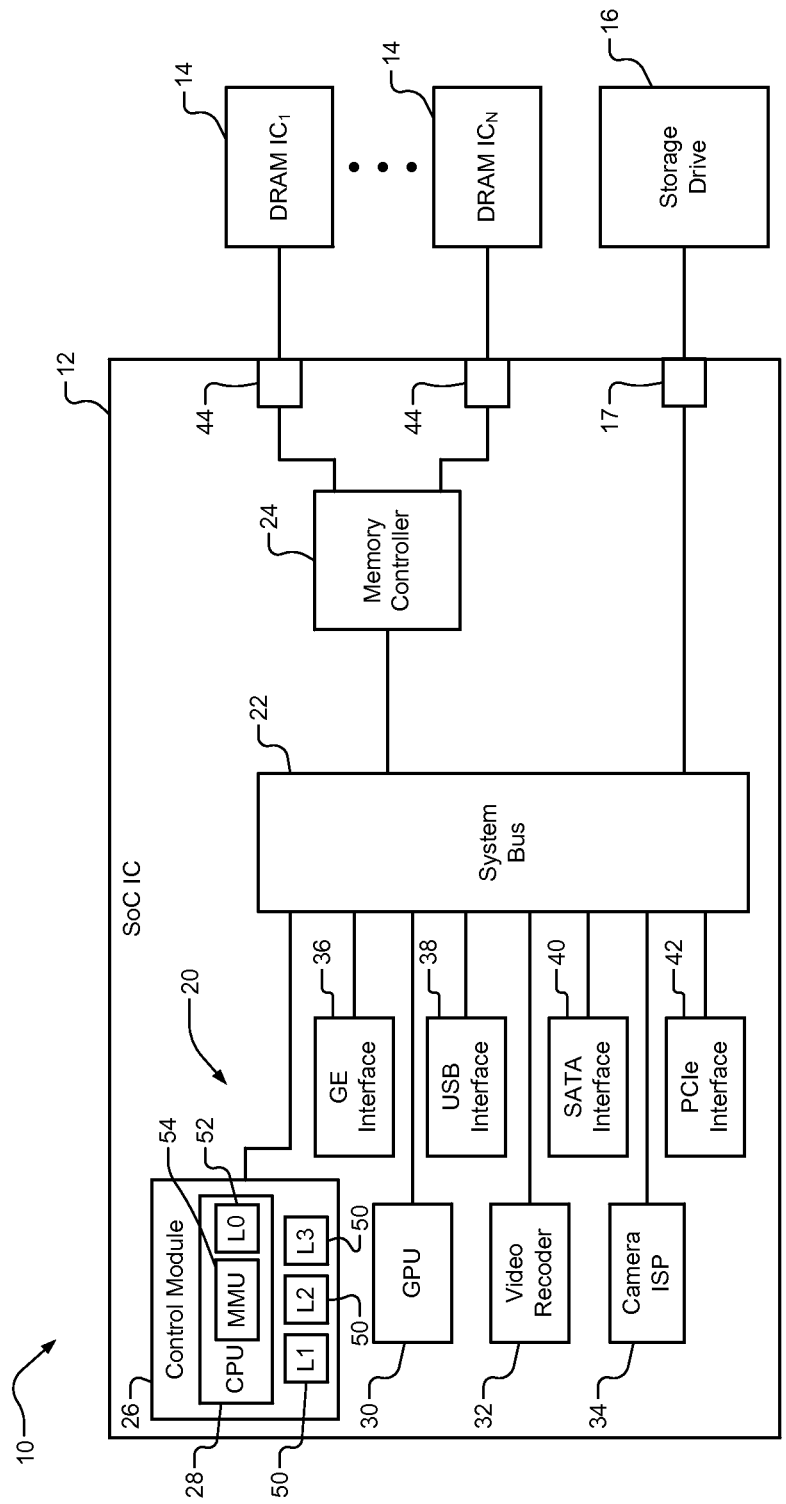
FIG. 1 is a functional block diagram of a device according to the prior art.
Figure 2:
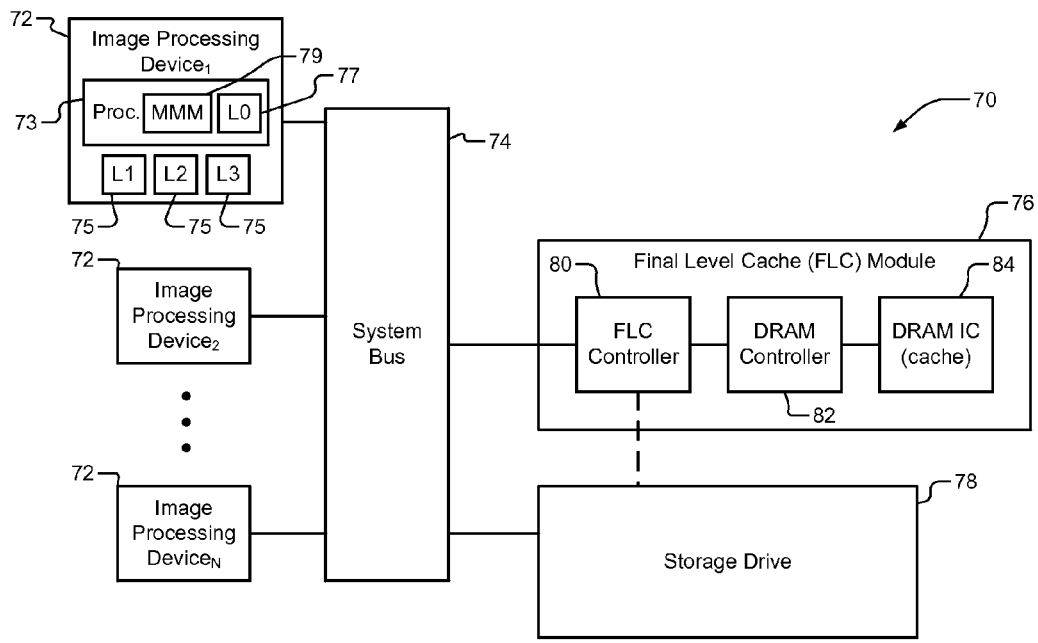
FIG. 2 is a functional block diagram of a data access system in accordance with an embodiment of the present disclosure.

FIG. 2 shows a data access system 70 that includes image processing devices 72, a system bus 74, a FLC module 76, and a storage drive 78. The data access system 70 may be implemented in, for example, a computer, a mobile phone, a tablet, a server and/or other device. The image processing devices 72 may include, for example: a central processor (or central processing unit (CPU)); a graphics processor (or graphics processing unit (GPU)); a video recorder; a camera image signal processor (ISP); an Ethernet interface such as a gigabit (Gb) Ethernet interface; a serial interface such as a universal serial bus (USB) interface and a serial advanced technology attachment (SATA) interface; and a peripheral component interconnect express (PCIe) interface; and/or other image processing devices. The image processing devices 72 may be implemented in one or more modules. As an example, a first one of the image processing modules 72 is shown as including cache memory, such as one or more of a level zero (L0) cache, a level one (L1) cache, a level two (L2) cache, or a level three (L3) cache. In the example shown, the first image processing device may include a central processor 73 and L1-L3 caches 75. The central processor 73 may include a L0 cache 77. The central processor 73 may also include a memory management module (MMM) 79, which can control access to the caches 75, 77. Tasks described below as being performed by an image processing device may be performed by, for example, the central processor 73 and/or the MMM 79.

The image processing devices 72 are connected to the FLC module 76 via the system bus 74. The image processing devices 72 are connected to the storage drive 78 via the bus and interfaces (i) between the image processing devices 72 and the system bus 74, and (ii) between the system bus 74 and the storage drive 78. The interfaces may include, for example, Ethernet interfaces, serial interfaces, PCIe interfaces and/or embedded multi-media controller (eMMC) interfaces. The storage drive 78 may be located anywhere in the world away from the image processing devices 72 and/or the FLC controller 80. The storage drive 78 may be in communication with the image processing devices 72 and/or the FLC controller 80 via one or more networks (e.g., a WLAN, an Internet network, or a remote storage network (or cloud)).

The FLC module 76 includes a FLC controller 80, a DRAM controller 82, and a DRAM IC 84. The DRAM IC 84 is used predominately as virtual storage while the storage drive 78 is used as physical storage. The image processing devices 72 address the DRAM IC 84 and the storage drive 78 as if they were a single storage device. While reading and/or writing data, the image processing devices 72 send access requests to the FLC controller 80. The FLC controller 80 accesses the DRAM IC 84 via the DRAM controller 82 and/or accesses the storage drive 78. The FLC controller 80 may access the storage drive directly (as indicated by dashed line) or via the system bus 74.

Various examples of the data access system 70 are described herein. In a first example, the FLC module 76 is implemented in a SoC separate from the image processing devices 72, the system bus 74 and the storage drive 78. In a second example, one of the image processing devices 72 is a CPU implemented image processing device. The one of the image processing devices 72 may be implemented in a SoC separate from the FLC module 76 and the storage drive 78. As another example, the image processing devices 72 and the system bus 74 are implemented in a SoC separate from the FLC module 76 and the storage drive 78. In another example, the image processing devices 72, the system bus 74 and the FLC module 76 are implemented in a SoC separate from the storage drive 78. Other examples of the data access system 70 are disclosed below.

The DRAM IC 84 may be used as a final level of cache. The DRAM IC 84 may have various storage capacities. For example, the DRAM IC 84 may have 1-4 GB of storage capacity for mobile phone applications, 4-32 GB of storage capacity for personal computer applications, and 32 GB-1 terabyte (T) of storage capacity for server applications.

The storage drive 78 may include flash memory (e.g., NAND flash memory), solid-state memory, a solid-state drive (SSD), a hard disk drive (HDD), and/or other nonvolatile memory. The storage drive 78 may be a hybrid drive and include, for example, solid-state memory and rotating storage media. The storage drive 78 may have more storage capacity than the DRAM IC 84. For example, the storage drive 78 may include 4-16 times more storage than the DRAM IC 84. As another example, the storage drive 78 may have an order of magnitude more storage capacity than the DRAM IC 84. The DRAM IC 84 may include high-speed DRAM and the storage drive 78 may include low-speed DRAM. In other words, speed of the DRAM IC 84 is faster than speed of the DRAM in the storage drive 78.

The data stored in the DRAM IC 84 may be data that is accessed most recently, most often, and/or has the highest associated priority level. The data stored in the DRAM IC 84 may include data that is locked. Data that is locked refers to data that is always stored in the DRAM IC 84. Locked data may be updated. The data stored in the DRAM IC 84 may be accessed more frequently and/or have higher priority levels than data stored in the storage drive 78.

In some examples, the data stored in the DRAM IC 84 does not include software applications, fonts, software code, alternate code and data to support different spoken languages, etc. that are not frequently used (e.g., accessed more than a predetermined number of times over a predetermined period of time). This can aid in minimizing size requirements of the DRAM IC 84. Software code that is not frequently used may be referred to as "garbage code" and may not be loaded from the storage drive 78 to the DRAM IC 84 during a boot up process. The boot up process may include only loading up frequently used data. As the size of the DRAM IC 84 decreases, performance increases and power consumption, capacitance and buffering decrease. As capacitance and buffering decrease, latencies decrease. Also, by consuming less power, the battery life of a corresponding device is increased.

The FLC controller 80 performs CAM techniques in response to receiving requests from the image processing devices 72. The CAM techniques include converting first physical address of the requests provided by the image processing devices 72 to virtual addresses. These virtual addresses are independent of and different than virtual addresses originally generated by the image processing devices 72 and mapped to the first physical addresses by the image processing devices 72. The DRAM controller 82 converts (or maps) the virtual addresses generated by the FLC controller 80 to second physical addresses. If the second physical addresses are not in the DRAM IC 84, the FLC controller 80 may (i) fetch the data from the storage drive 78, or (ii) may indicate to (or signal) the corresponding one of the image processing devices 72 that a cache miss has occurred. Fetching the data from the storage drive 78 may include mapping the virtual addresses generated by the FLC controller 80 to third physical addresses to access the data in the storage drive 78. A cache miss may be detected by the FLC controller 80 while translating a physical address to a virtual address and/or by the DRAM controller 82 while translating the virtual address to a second physical address. The DRAM controller 82 may signal the FLC controller 80 that a cache miss has occurred and then the FLC controller 80 may signal one of the image processing devices 72 of the cache miss or may access the storage drive 78 for the data.

If the FLC controller 80 signals the corresponding one of the image processing devices 72 that a cache miss has occurred, then the corresponding one of the image processing devices 72 may access the data in the storage drive 78. This may include (i) accessing the data in the storage drive 78 based on the first physical addresses, (ii) mapping the originally generated virtual addresses to the third physical addresses and then accessing the storage drive 78 based on the third physical addresses, or (iii) mapping the first physical addresses to the third physical addresses and then accessing the storage drive 78 based on the third physical addresses. The CAM techniques include address mapping between the DRAM IC 84 and the storage drive 78.

For example, the CAM techniques may provide full set associative address translation. This may include comparing the first physical addresses to all virtual addresses stored in a directory of the FLC controller 80. Full set associative address translation may be used by the FLC controller 80 to translate the first physical addresses of corresponding data requests to the second virtual addresses (or the virtual addresses generated by the FLC controller 80). This may include comparing the first physical addresses to all addresses in a first directory to find matches for conversion to virtual addresses. Full set associative address translation may also be used by the DRAM controller 82 to compare the second virtual addresses to all addresses of all entries in a second directory, the DRAM IC 84, and/or the storage drive 78 to find matches for conversion to second physical addresses. A hit rate of data being located in the DRAM IC 84 after initial boot up may be as high as 100% depending on the size of the DRAM IC 84. The DRAM IC 84 may be sized to assure a near 100% hit rate with minimal idle time of a processor and/or image processing device. For example, this may be accomplished using a 1-4 GB DRAM IC for mobile phone applications, 4-32 GB DRAM ICs for personal computer applications, and 32-500 GB DRAM ICs for server applications.

Figure 3:
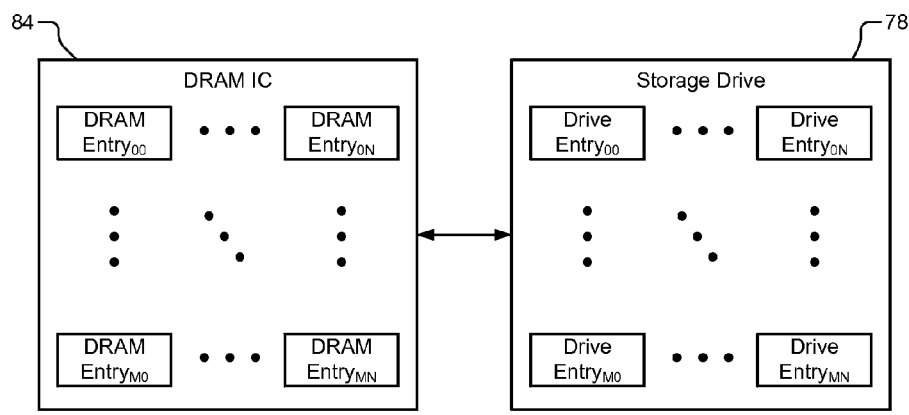
FIG. 3 is a functional block diagram illustrating entries of a DRAM and a storage drive of the data access system of FIG. 2.

In addition to FIG. 2, FIG. 3 shows entries of the DRAM IC 84 and the storage drive 78 of the data access system 70. The DRAM IC 84 may include DRAM entries$_{00\text{-}MN}$. The storage drive 78 may have drive entries$_{00\text{-}MN}$. Addresses of each of the DRAM entries$_{00\text{-}MN}$ may be mapped to one or more addresses of the drive entries$_{00\text{-}MN}$. As a result, first portions of data stored in one or more of the DRAM entries$_{00\text{-}MN}$ may correspond to second portions of the data stored in the drive entries$_{00\text{-}MN}$. The data stored in the DRAM entries$_{00\text{-}MN}$ may include metadata providing information regarding the data stored in the drive entries$_{00\text{-}MN}$. The information may include data types and/or lengths of the data stored in the drive entries$_{00\text{-}MN}$.

As an example, each of the DRAM entries$_{00\text{-}MN}$ may have, for example, 16 KB of storage capacity. Each of the drive entries$_{00\text{-}MN}$ may have 16 GB of storage capacity. If data is to be read from or written to one of the DRAM entries$_{00\text{-}MN}$ and the one of the DRAM entries$_{00\text{-}MN}$ is full and/or does not have all of the data associated with a request, a corresponding one of the drive entries$_{00\text{-}MN}$ is accessed. Thus, the DRAM IC 84 and the storage drive 78 may be divided up into blocks of memory. Each block of memory in the DRAM IC 84 may have a respective one or more blocks of memory in the storage drive 78. This mapping and division of memory may be transparent to the image processing devices 72 of FIG. 2.

During operation, one of the image processing devices 72 may generate a request signal for a block of data. If a block of data is not located in the DRAM IC 84, the FLC controller 80 may access the block of data in the storage drive 78. While the FLC controller 80 is accessing the data from the storage drive 78, the FLC controller 80 may send a bus error signal (or alert signal) back to the image processing device that requested the data. The bus error signal may indicate that the FLC controller 80 is accessing the data and as a result the system bus 74 is not ready for transfer of the data to the image processing device 72. The transmission of the bus error signal may be referred to as a "bus abort" from the FLC module 76 to the image processing device and/or SoC of the image processing device 72. The image processing device 72 may perform other tasks while waiting for the bus to be ready. The other tasks may include using data already stored in, for example, one or more caches (e.g., L0-L3 caches) in the SoC of the image processing device. This also minimizes idle time of a processor and/or image processing device.

If sequential access is performed, the FLC controller 80 and/or the DRAM controller 82 may perform predictive fetching of data stored at addresses expected to be accessed in the future. This may occur during a boot up and/or subsequent to the boot up. The FLC controller 80 and/or the DRAM controller 82 may: track data and/or software usage; evaluate upcoming lines of code to be executed; track memory access patterns; and based on this information predict next addresses of data expected to be accessed. The next addresses may be addresses of the DRAM IC 84 and/or the storage drive 78. As an example, the FLC controller 80 and/or the DRAM controller 82, independent of and/or without previously receiving a request for data, may access the data stored in the storage drive 78 and transfer the data to the DRAM IC 84. As another example, the FLC controller 80 and/or the DRAM controller 82, independent of and/or without previously receiving a request for data, may access the data stored in the DRAM IC 84 and transfer the data to the system bus 74 and/or one of the image processing devices 72.

Figure 4:
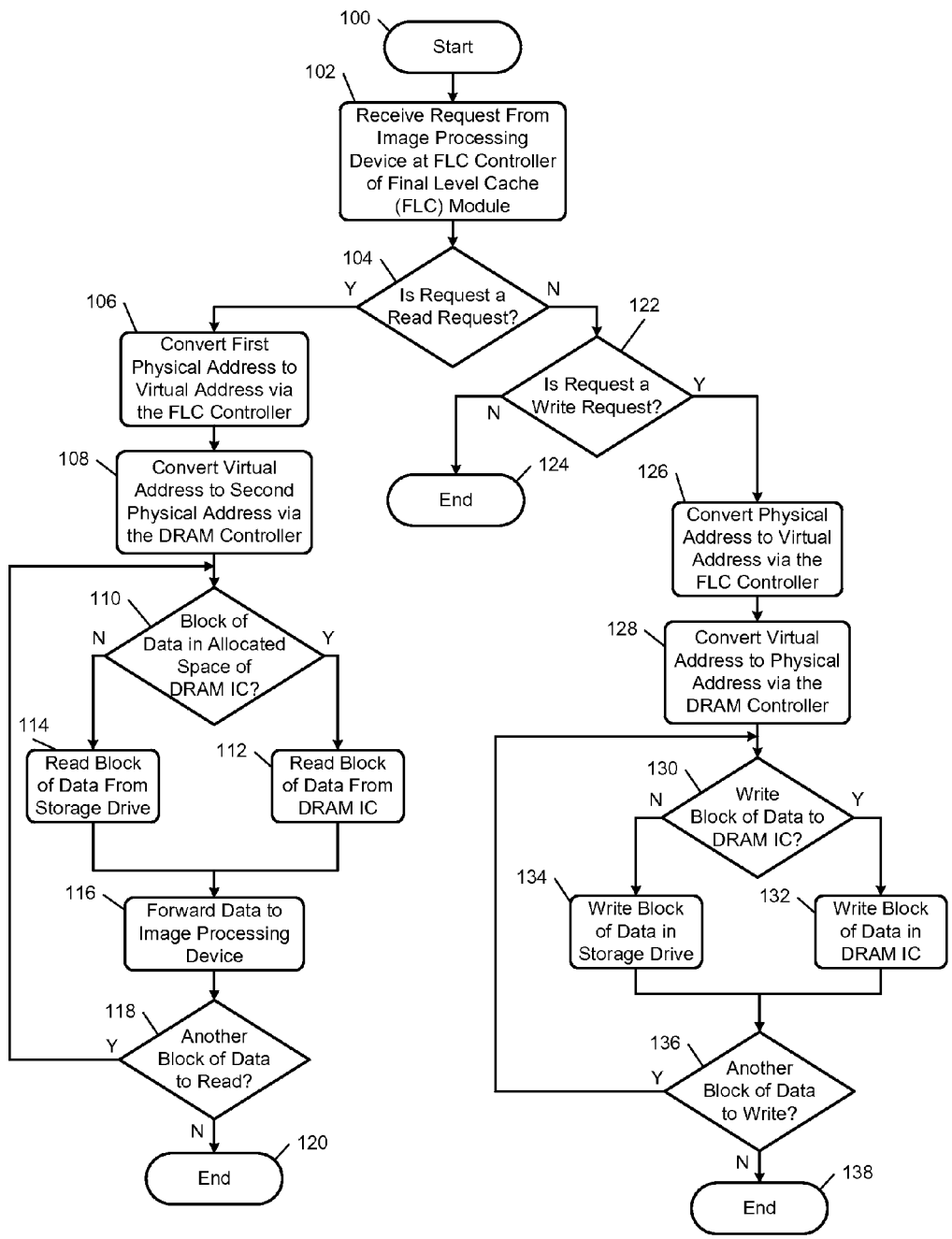
FIG. 4 illustrates a method of operating the data access system of FIG. 2.

Operation of the data access system 70 is further described with respect to the method of FIG. 4. Although the following tasks are primarily described with respect to the examples in FIGS. 2-4, the tasks may be easily modified to apply to other examples in the present disclosure. The tasks may be performed iteratively.

The method starts at 100. At 102, the FLC controller 80 receives a request from one of the image processing devices 72. The request may be a read request or a write request.

At 104, the FLC controller 80 determines whether the received request is a read request. Task 106 is performed if the request is a read request, otherwise task 122 is performed. At 106, the FLC controller 80 converts a first physical address provided in the received request to a virtual address. The virtual address may be associated with a physical address in the DRAM IC 84 and/or a physical address in the storage drive 78.

At 108, the DRAM controller 82 converts the virtual address to a second physical address. The FLC controller 80 and/or the DRAM controller 82 may include one or more translation mapping tables for mapping first physical addresses to virtual addresses and for mapping the virtual addresses to second physical addresses. The tables may be shared between the FLC controller 80 and the DRAM controller 82.

At 110, the DRAM controller 82 determines whether the second physical address is in the DRAM IC 84 and thus whether a corresponding block of data is in allocated space of the DRAM IC 84. If the second physical address is in the DRAM IC 84, task 112 is performed, otherwise task 114 is performed.

At 112 and based on the second physical address, the DRAM controller 82 reads one or more first blocks of data associated with the received request from the DRAM IC 84. Each of the first blocks of data may have a corresponding physical address in the DRAM IC 84.

At 114 and based on the second physical address, the FLC controller 80 reads one or more second blocks of data associated with the received request from the storage drive 78. The one or more second blocks of data may include the first blocks of data. Each of the second blocks of data may have a corresponding physical address in the storage drive 78. The second blocks of data and corresponding addresses of the storage drive 78 may correspond respectively to the first blocks of data and corresponding addresses of the DRAM IC 84.

At 116, the data read from the DRAM IC 84 or the storage drive 78 is forwarded to the image processing device that sent the received request. At 118, for the request received at 102, the FLC controller 80 and/or the DRAM controller 82 may determine whether there is additional data to be read from the DRAM IC 84 and/or the storage drive 78. If there is additional data to be read, task 110 is performed, otherwise the method may end at 120. As an alternative to returning to task 110 and for the request received at 102, if there is additional data to be read and if there is another physical address to be converted, task 106 may be performed subsequent to task 118.

At 122, the FLC controller 80 determines whether the received request is a write request. If the received request is a write request, task 126 is performed, otherwise the method may end at 124. At 126, the FLC controller 80 converts the first physical address provided in the received request to a virtual address. The virtual address may be associated with a physical address in the DRAM IC 84 and/or a physical address in the storage drive 78. At 128, the DRAM controller 82 converts the virtual address to a second physical address. Tasks 126 and 128 may be accomplished using the above-mentioned mapping tables.

At 130, the DRAM controller 82 determines whether the second physical address is in the DRAM IC 84 and thus whether a corresponding block of data is to be written to an allocated space in the DRAM IC 84. If the second physical address is in the DRAM IC 84, task 132 is performed, otherwise task 134 is performed.

At 132 and based on the second physical address, the DRAM controller 82 writes one or more first blocks of data associated with the received request to the DRAM IC 84. Each of the first blocks of data may have a corresponding physical address in the DRAM IC 84.

At 134 and based on the second physical address, the FLC controller 80 writes one or more second blocks of data associated with the received request to the storage drive 78. The one or more second blocks of data may include the first blocks of data. Each of the second blocks of data may have a corresponding physical address in the storage drive 78. The second blocks of data and corresponding addresses of the storage drive 78 may correspond respectively to the first blocks of data and corresponding addresses of the DRAM IC 84.

At 136, for the request received at 102, the FLC controller 80 and/or the DRAM controller 82 may determine whether there is additional data to be written to the DRAM IC 84 and/or the storage drive 78. If there is additional data to be written, task 130 is performed, otherwise the method may end at 138. As an alternative to returning to task 130 and for the request received at 102, if there is additional data to be written and if there is another physical address to be converted, task 126 may be performed subsequent to task 136.

The above-described tasks of FIG. 4 are meant to be illustrative examples; the tasks may be performed sequentially, synchronously, simultaneously, continuously, during overlapping time periods or in a different order depending upon the application. Also, any of the tasks may not be performed or skipped depending on the example and/or sequence of events.

The above-described examples may be implemented via servers in a network (may be referred to as a "cloud"). Each of the servers may include a FLC module (e.g., the FLC module 76) and communicate with each other. The servers may share DRAM and/or memory stored in the DRAM ICs and the storage drives. Each of the servers may access the DRAMs and/or storage drives in other servers via the network. Each of the FLC modules may operate similar to the FLC module of FIG. 2, but may also access DRAM and/or memory in each of the other servers via the cloud. Signals transmitted between the servers and the cloud may be encrypted prior to transmission and decrypted upon arrival at the server and/or network device of the cloud. The servers may also share and/or access memory in the cloud. As an example, a virtual address generated by a FLC controller of one of the servers may correspond to a physical address in: a DRAM of the FLC module of the FLC controller; a storage drive of the one of the servers; a DRAM of a FLC module of one of the other servers; a storage drive of one of the other servers; or a storage device of the cloud. The FLC controller and/or an image processing device of the one of the servers may access the DRAM and/or memory in the other FLC modules, storage drives, and/or storage devices if a cache miss occurs.

The above-described examples may also be implemented in a data access system including: a multi-chip module having multiple chips; a switch; and a primary chip having a primary FLC module. The multi-chip module is connected to the primary chip module via the switch. Each of the FLC modules may operate similar to the FLC module of FIG. 2, but may also access DRAM and/or memory in each of the other chips via the switch. As an example, a virtual address generated by a FLC controller of one of the chips may correspond to a physical address in: a DRAM of the FLC module of the FLC controller; a storage drive of the one of the chips; a DRAM of a FLC module of one of the other chips; a storage drive of one of the other chips; or a storage device of the cloud. The FLC controller and/or an image processing device of the one of the chips may access the DRAM and/or memory in the other FLC modules, storage drives, and/or storage devices if a cache miss occurs.

As an example, each of the secondary DRAMs in the multi-chip module and the primary DRAM in the primary chip may have 1 GB of storage capacity. A storage drive in the primary chip may have, for example, 64 GB of storage capacity. As another example, the data access system may be used in an automotive vehicle. The primary chip may be, for example, a central controller, a module, a processor, an engine control module, a transmission control module, and/or a hybrid control module. The primary chip may be used to control corresponding aspects of related systems, such as a throttle position, spark timing, fuel timing, transitions between transmission gears, etc. The secondary chips in the multi-chip module may each be associated with a particular vehicle system, such as a lighting system, an entertainment system, an air-conditioning system, an exhaust system, a navigation system, an audio system, a video system, a braking system, a steering system, etc. and used to control aspects of the corresponding systems.

As yet another example, the above-described examples may also be implemented in a data access system that includes a host (or SoC) and a hybrid drive. The host may include a central processor or other image processing device and communicate with the hybrid drive via an interface. The interface may be, for example, a GE interface, a USB interface, a SATA interface, a PCIe interface, or other suitable interface. The hybrid drive includes a first storage drive and a second storage drive. The first storage drive includes an FLC module (e.g., the FLC module 76 of FIG. 2). A FLC controller of the FLC module performs CAM techniques when determining whether to read data from and/or write data to DRAM of the FLC module and the second storage drive.

As a further example, the above-described examples may also be implemented in a storage system that includes a SoC, a first DRAM (or cache), a second DRAM, and a nonvolatile memory. The SoC is separate from the first DRAM, the discrete DRAM and the nonvolatile memory. The first DRAM may store high-priority and/or frequently accessed data. A high-percentage of data access requests may be directed to data stored in the first DRAM. As an example, 99% or more of the data access requests may be directed to data stored in the first DRAM and the remaining 1% or less of the data access requests may be directed to data stored in the second DRAM and/or the nonvolatile memory. Low-priority and/or less frequently accessed data may be stored in the second DRAM and/or the nonvolatile memory. As an example, a user may have multiple web browsers open. The second DRAM can have a high-bandwidth interface and low-cost-per-bit memory storage capacity and can handle a wide range of applications. The second DRAM typically exhibits longer latency periods than cache or the first DRAM. Content for a currently used or a most frequently used web browser may be stored in the first DRAM, whereas content for the other web browsers may be stored in the second DRAM and/or the nonvolatile memory.

The SoC may include one or more control modules, an interface module, a cache (or FLC) module, and a graphics module. The cache module may operate similar to the FLC module of FIG. 2. The control modules are connected to the cache module via the interface module. The cache module is configured to access the first DRAM, the second DRAM and the nonvolatile memory based on respective hierarchical levels. Each of the control modules may include respective L1, L2, and L3 caches. Each of the control modules may also include one or more additional caches, such as L4 cache or other highest-level cache. Many signal lines (or conductive elements) may exist between the SoC and the first DRAM. This allows for quick parallel and/or serial transfer of data between the SoC and the first DRAM. Data transfer between the SoC and the first DRAM is quicker than data transfer (i) between the SoC and the second DRAM, and (ii) between the SoC and the nonvolatile memory.

The first DRAM may have a first portion with a same or higher hierarchical level than the L3 cache 622, the L4 cache, and/or the highest-level cache. A second portion of the first DRAM may have a same or lower hierarchical level than the second DRAM and/or the nonvolatile memory. The second DRAM may have a higher hierarchical level than the first DRAM. The nonvolatile memory may have a same or higher hierarchical level than the second DRAM. The control modules may change hierarchical levels of portions or all of each of the first DRAM, the second DRAM, and/or the nonvolatile memory based on, for example, caching needs.

The control modules, a graphics module connected to the interface module, and/or other devices (internal or external to the SoC) connected to the interface module may send request signals to the cache module to store and/or access data in the first DRAM, the second DRAM, and/or the nonvolatile memory. The cache module may control access to the first DRAM, the second DRAM, and the nonvolatile memory. As an example, the control modules, the graphics module, and/or other devices connected to the interface module may be unaware of the number and/or size of DRAMs that are connected to the SoC.

The cache module may convert first logical block addresses and/or requests received from the control modules, the graphics module, and/or other devices connected to the interface module to (i) physical block addresses of the first DRAM, the second DRAM, and/or the nonvolatile memory, or (ii) second logical block addresses. The second logical block addresses may be converted to physical block addresses by the first DRAM, the second DRAM, and/or the nonvolatile memory. The cache module may store one or more lookup tables (e.g., fully set associative lookup tables) for the conversion of the first logical block addresses to the second logical block addresses and/or conversion of the first logical block addresses to physical block addresses. As a result, the cache module and one or more of the first DRAM, the second DRAM, and the nonvolatile memory may operate as a single memory relative to the control modules, the graphics module, and/or other devices connected to the interface module. The graphics module may control output of video data from the control modules and/or the SoC to a display and/or the other video device.

The control modules may swap (or transfer) data, data sets, programs, and/or portions thereof between (i) the cache module, and (ii) the L1 cache, L2 cache, and L3 cache. The cache module may swap (or transfer) data, data sets, programs and/or portions thereof between two or more of the first DRAM, the second DRAM and the nonvolatile memory. This may be performed independent of the control modules and/or without receiving control signals from the control modules to perform the transfer. The storage location of data, data sets, programs and/or portions thereof in one or more of the first DRAM, the second DRAM and the nonvolatile memory may be based on the corresponding priority levels, frequency of use, frequency of access, and/or other parameters associated with the data, data sets, programs and/or portions thereof. The transferring of data, data sets, programs and/or portions thereof may include transferring blocks of data. Each of the blocks of data may have a predetermined size. As an example, a swap of data from the second DRAM to the first DRAM may include multiple transfer events, where each transfer event includes transferring a block of data (e.g., 16 KB of data).

The cache module may use the first DRAM as set associative cache, directed mapped cache, and/or fully associative cache and access the first DRAM using corresponding cache protocols. The cache module may be referred to as a last (or highest) level cache (LLC) controller.

The first DRAM may have a first predetermined amount of storage capacity (e.g., 0.25 GB, 0.5 GB, 1 GB, or 8 GB). A 0.5 GB first DRAM is 512 times as large as a typical L2 cache. The second DRAM may have a second predetermined amount of storage capacity (e.g., 1 GB or more for non-server based systems or 256 GB or more server based systems). The nonvolatile memory may have a third predetermined amount of storage capacity (e.g., 256 GB or more). The nonvolatile memory may include solid-state memory, such as flash memory or magnetoresistive random access memory (MRAM), and/or rotating magnetic media. The nonvolatile memory may include a SSD and a HDD. Although the storage system has the second DRAM and the nonvolatile memory, either one of the second DRAM and the nonvolatile memory may not be included in the storage system.

As a further example, the above-described examples may also be implemented in a storage system that includes a SoC and a DRAM IC. The SoC may include multiple control modules (or processors) that access the DRAM IC via a ring bus. The ring bus may be a bi-directional bus that minimizes access latencies. If cost is more important than performance, the ring bus may be a unidirectional bus. Intermediary devices may be located between the control modules and the ring bus and/or between the ring bus and the DRAM IC. For example, the above-described cache module may be located between the control modules and the ring bus or between the ring bus and the DRAM IC.

The DRAM IC may be a L3, L4, and/or highest level cache. The control modules may share the DRAM IC and/or have designated portions of the DRAM IC. For example, a first portion of the DRAM IC may be allocated as cache for the first control module. A second portion of the DRAM IC may be allocated as cache for the second control module. A third portion of the DRAM IC may be allocated as cache for the third control module. A fourth portion of the DRAM IC may not be allocated as cache.

As a further example, the above-described examples may also be implemented in a server system. The server system may be referred to as a storage system and include multiple servers. The servers include respective storage systems, which are in communication with each other via a network (or cloud). One or more of the storage systems may be located in the cloud. Each of the storage systems may include respective SoCs.

The SoCs may have respective first DRAMs, second DRAMs, solid-state nonvolatile memories, nonvolatile memories and I/O ports. The I/O ports may be in communication with the cloud via respective I/O channels, such as peripheral component interconnect express (PCIe) channels, and respective network interfaces, such as such as peripheral component interconnect express (PCIe) channels. The I/O ports, I/O channels, and network interfaces may be Ethernet ports, channels and network interfaces and transfer data at predetermined speeds (e.g., 1 gigabit per second (Gb/s), 10 Gb/s, 50 Gb/s, etc.). Some of the network interfaces may be located in the cloud. The connection of multiple storage systems provides a low-cost, distributed, and scalable server system. Multiples of the disclosed storage systems and/or server systems may be in communication with each other and be included in a network (or cloud).

The solid-state nonvolatile memories may each include, for example, NAND flash memory and/or other solid-state memory. The nonvolatile memories may each include solid-state memory and/or rotating magnetic media. The nonvolatile memories may each include a SSD and/or a HDD.

The architecture of the server system provides DRAMs as caches. The DRAMs may be allocated as L3, L4 and/or highest level caches for the respective SoCs and have a high-bandwidth and large storage capacity. The stacked DRAMs may include, for example, DDR3 memory, DDR4 memory, low power double data rate type four (LPDDR4) memory, wide-I/O2 memory, HMC memory, and/or other suitable DRAM. Each of the SoCs may have one or more control modules. The control modules communicate with the corresponding DRAMs via respective ring buses. The ring buses may be bi-directional buses. This provides high-bandwidth and minimal latency between the control modules and the corresponding DRAMs.

Each of the control modules may access data and/or programs stored: in control modules of the same or different SoC; in any of the DRAMs; in any of the solid-state nonvolatile memories; and/or in any of the nonvolatile memories.

The SoCs and/or ports of the SoCs may have medium access controller (MAC) addresses. The control modules (or processors) of the SoCs may have respective processor cluster addresses. Each of the control modules may access other control modules in the same SoC or in another SoC using the corresponding MAC address and processor cluster address. Each of the control modules of the SoCs may access the DRAMs. A control module of a first SoC may request data and/or programs stored in a DRAM connected to a second SoC by sending a request signal having the MAC address of the second SOC and the processor cluster address of a second control module in the second SoC.

Each of the SoCs and/or the control modules in the SoCs may store one or more address translation tables. The address translation tables may include and/or provide translations for: MAC addresses of the SoCs; processor cluster addresses of the control modules; logical block addresses of memory cells in the DRAMs, the solid-state nonvolatile memories, and the nonvolatile memories; and/or physical block addresses of memory cells in the DRAMs, the solid-state nonvolatile memories, and the nonvolatile memories.

As an example, data and programs may be stored in the solid-state nonvolatile memories and/or the nonvolatile memories. The data and programs and/or portions thereof may be distributed over the network to the SoCs and control modules. Programs and/or data needed for execution by a control module may be stored locally in the DRAMs, a solid-state nonvolatile memory, and/or a nonvolatile memory of the SoC in which the control module is located. The control module may then access and transfer the programs and/or data needed for execution from the DRAMs, the solid-state nonvolatile memory, and/or the nonvolatile memory to caches in the control module. Communication between the SoCs and the network and/or between the SoCs may include wireless communication.

As a further example, the above-described examples may also be implemented in a server system that includes SoCs. Some of the SoCs may be incorporated in respective servers and may be referred to as server SoCs. Some of the SoCs (referred to as companion SoCs) may be incorporated in a server of a first SoC or may be separate from the server of the first SoC. The server SoCs include respective: clusters of control modules (e.g., central processing modules); intra-cluster ring buses, FLC modules, memory control modules, FLC ring buses, and one or more hopping buses. The hopping buses extend (i) between the server SoCs and the companion SoCs via inter-chip bus members and corresponding ports and (ii) through the companion SoCs. A hopping bus may refer to a bus extending to and from hopping bus stops, adaptors, or nodes and corresponding ports of one or more SoCs. A hopping bus may extend through the hopping bus stops and/or the one or more SoCs. A single transfer of data to or from a hopping bus stop may be referred to as a single hop. Multiple hops may be performed when transferring data between a transmitting device and a receiving device. Data may travel between bus stops each clock cycle until the data reaches a destination. Each bus stop disclosed herein may be implemented as a module and include logic to transfer data between devices based on a clock signal. Also, each bus disclosed herein may have any number of channels for the serial and/or parallel transmission of data.

Each of the clusters of control modules has a corresponding one of the intra-cluster ring buses. The intra-cluster ring buses are bi-directional and provide communication between the control modules in each of the clusters. The intra-cluster ring buses may have ring bus stops for access by the control modules to data signals transmitted on the intra-cluster ring buses. The ring bus stops may perform as signal repeaters and/or access nodes. The control modules may be connected to and access the intra-cluster ring buses via the ring bus stops. Data may be transmitted around the intra-cluster ring buses from a first control module at a first one of the ring bus stops to a second control module at a second one of the ring bus stops. Each of the control modules may be a central processing unit or processor.

Each of the memory control modules may control access to the respective one of the FLC modules. The FLC modules may be stacked on the server SoCs. Each of the FLC modules includes a FLC (or DRAM) and may be implemented as and operate similar to any of the FLC modules disclosed herein. The memory control modules may access the FLC ring buses at respective ring bus stops on the FLC ring buses and transfer data between the ring bus stops and the FLC modules. Alternatively, the FLC modules may directly access the FLC ring buses at respective ring bus stops. Each of the memory control modules may include memory clocks that generate memory clock signals for a respective one of the FLC modules and/or for the bus stops of the ring buses and/or the hopping buses. The bus stops may receive the memory clock signals indirectly via the ring buses and/or the hopping buses or directly from the memory control modules. Data may be cycled through the bus stops based on the memory clock signal.

The FLC ring buses may be bi-directional buses and have two types of ring bus stops $S_{RB}$ and $S_{RH}$. Each of the ring bus stops may perform as a signal repeater and/or as an access node. The ring bus stops $S_{RB}$ are connected to devices other than hopping buses. The devices may include: an inter-cluster ring bus0; the FLC modules and/or memory control modules; and graphics processing modules. The inter-cluster ring bus provides connections (i) between the clusters, and (ii) between intersection rings stops. The intersection ring bus stops provide access to and may connect the inter-cluster ring bus to ring bus extensions that extend between (i) the clusters and (ii) ring bus stops. The ring bus stops are on the FLC ring buses. The inter-cluster ring bus and the intersection ring bus stops provide connections (iii) between the first cluster and the ring bus stop of the second FLC ring bus, and (iv) between the second cluster and the ring bus stop of the first FLC ring bus. This allows the control modules to access the FLC of the second FLC module and the control modules to access the FLC of the first FLC module.

The inter-cluster ring bus may include intra-chip traces and inter-chip traces. The intra-chip traces extend internal to the server SoCs and between (i) one of the ring bus stops and (ii) one of the ports. The inter-chip traces extend external to the server SoCs and between respective pairs of the ports.

The ring bus stops $S_{RH}$ of each of the server SoCs are connected to corresponding ones of the FLC ring buses and hopping buses. Each of the hopping buses has multiple hopping bus stops $S_{HB}$, which provide respective interfaces access to a corresponding one of the hopping buses. The hopping bus stops $S_{HB}$ may perform as signal repeaters and/or as access nodes.

The first hopping bus, a ring bus stop, and first hopping bus stops provide connections between (i) the FLC ring bus and (ii) a liquid crystal display (LCD) interface in the server SoC and interfaces of the companion SoCs. The LCD interface may be connected to a display and may be controlled via the GPM. The interfaces of the companion SoC include a serial attached small computer system interface (SAS) interface and a PCIe interface. The interfaces of the companion SoC are image processor (IP) interfaces.

The interfaces are connected to respective ports, which may be connected to devices, such as peripheral devices. The SAS interface and the PCIe interface may be connected respectively to a SAS compatible device and PCIe compatible device via the ports. As an example, a storage drive may be connected to the port. The storage drive may be a hard disk drive, a solid-state drive, or a hybrid drive. The ports may be connected to image processing devices. Examples of image processing devices are disclosed above. The fourth SoC may be daisy chained to the third SoC via the inter-chip bus member (also referred to as a daisy chain member). The inter-chip bus member is a member of the first hopping bus. Additional SoCs may be daisy chained to the fourth SoC via port, which is connected to the first hopping bus. The server SoC, the control modules, and the FLC module may communicate with the fourth SoC via the FLC ring bus, the first hopping bus and/or the third SoC. As an example, the SoCs may be southbridge chips and control communication and transfer of interrupts between (i) the server SoC and (ii) peripheral devices connected to the ports.

The second hopping bus provides connections, via a ring bus stop and second hopping bus stops, between (i) the FLC ring bus and (ii) interfaces in the server SoC. The interfaces in the server SoC may include an Ethernet interface, one or more PCIe interfaces, and a hybrid (or combination) interface. The Ethernet interface may be a 10 GE interface and is connected to a network via a first Ethernet bus. The Ethernet interface may communicate with the second SoC via the first Ethernet bus, the network and a second Ethernet bus. The network may be an Ethernet network, a cloud network, and/or other Ethernet compatible network. The one or more PCIe interfaces may include as examples a third generation PCIe interface PCIe3 and a mini PCIe interface (mPCIe). The PCIe interfaces may be connected to solid-state drives. The hybrid interface may be SATA and PCIe compatible to transfer data according to SATA and/or PCIe protocols to and from SATA compatible devices and/or PCIe compatible devices. As an example, the PCIe interface may be connected to a storage drive, such as a solid-state drive or a hybrid drive. The interfaces have respective ports for connection to devices external to the server SoC.

The third hopping bus may be connected to the ring bus via a ring bus stop and may be connected to a LCD interface and a port via a hopping bus stop. The LCD interface may be connected to a display and may be controlled via the GPM. The port may be connected to one or more companion SoCs. The fourth hopping bus may be connected to (i) the ring bus via a ring bus stop, and (ii) interfaces via hopping bus stops. The interfaces may be Ethernet, PCIe and hybrid interfaces. The interfaces have respective ports.

The server SoCs and/or other server SoCs may communicate with each other via the inter-cluster ring bus. The server SoCs and/or other server SoCs may communicate with each other via respective Ethernet interfaces and the network.

The companion SoCs may include respective control modules. The control modules may access and/or control access to the interfaces via the hopping bus stops. In one embodiment, the control modules are not included. The control modules may be connected to and in communication with the corresponding ones of the hopping bus stops and/or the corresponding ones of the interfaces.

As a further example, the above-described examples may also be implemented in a circuit of a mobile device. The mobile device may be a computer, a cellular phone, or other a wireless network device. The circuit includes SoCs. The SoC may be referred to as a mobile SoC. The SoC may be referred to as a companion SoC. The mobile SoC includes: a cluster of control modules; an intra-cluster ring bus, a FLC module, a memory control module, a FLC ring bus, and one or more hopping buses. The hopping bus extends (i) between the mobile SoC and the companion SoC via an inter-chip bus member and corresponding ports and (ii) through the companion SoC.

The intra-cluster ring bus is bi-directional and provides communication between the control modules. The intra-cluster ring bus may have ring bus stops for access by the control modules to data signals transmitted on the intra-cluster ring bus. The ring bus stops may perform as signal repeaters and/or access nodes. The control modules may be connected to and access the intra-cluster ring bus via the ring bus stops. Data may be transmitted around the intra-cluster ring bus from a first control module at a first one of the ring bus stops to a second control module at a second one of the ring bus stops. Data may travel between bus stops each clock cycle until the data reaches a destination. Each of the control modules may be a central processing unit or processor.

The memory control module may control access to the FLC module. In one embodiment, the memory control module is not included. The FLC module may be stacked on the mobile SoC. The FLC module may a FLC or DRAM and may be implemented as and operate similar to any of the FLC modules disclosed herein. The memory control module may access the FLC ring bus at a respective ring bus stop on the FLC ring bus and transfer data between the ring bus stop and the FLC module. Alternatively, the FLC module may directly access the FLC ring bus a respective ring bus stop. The memory control module may include a memory clock that generates a memory clock signal for the FLC module, the bus stops of the ring bus and/or the hopping buses. The bus stops may receive the memory clock signal indirectly via the ring bus and/or the hopping buses or directly from the memory control module. Data may be cycled through the bus stops based on the memory clock signal.

The FLC ring bus may be a bi-directional bus and have two types of ring bus stops $S_{RB}$ and $S_{RH}$. Each of the ring bus stops may perform as a signal repeater and/or as an access node. The ring bus stops $S_{RB}$ are connected to devices other than hopping buses. The devices may include: the cluster; the FLC module and/or the memory control module; and a graphics processing module.

The ring bus stops $S_{RH}$ of the mobile SoC are connected to the FLC ring bus and a corresponding one of the hopping buses. Each of the hopping buses has multiple hopping bus stops $S_{HB}$, which provide respective interfaces access to a corresponding one of the hopping buses. The hopping bus stops $S_{HB}$ may perform as signal repeaters and/or as access nodes.

The first hopping bus, a ring bus stop, and first hopping bus stops are connected between (i) the FLC ring bus and (ii) a liquid crystal display (LCD) interface, a video processing module (VPM), and interfaces of the companion SoC. The LCD interface is in the server SoC and may be connected to a display and may be controlled via the GPM. The interfaces of the companion SoC include a cellular interface, a wireless local area network (WLAN) interface, and an image signal processor interface. The cellular interface may include a physical layer device for wireless communication with other mobile and/or wireless devices. The physical layer device may operate and/or transmit and receive signals according to long-term evolution (LTE) standards and/or third generation (3G), fourth generation (4G), and/or fifth generation (5G) mobile telecommunication standards. The WLAN interface may operate according to Bluetooth®, Wi-Fi®, and/or other WLAN protocols and communicate with other network devices in a WLAN of the mobile device. The ISP interface may be connected to image processing devices (or image signal processing devices) external to the companion SoC, such as a storage drive or other image processing device. The interfaces may be connected to devices external to the companion SoC via respective ports. The ISP interface may be connected to devices external to the mobile device.

The companion SoC may be connected to the mobile SoC via the inter-chip bus member. The inter-chip bus member is a member of the first hopping bus. Additional SoCs may be daisy chained to the companion SoC via a port, which is connected to the first hopping bus. The mobile SoC, the control modules, and the FLC module may communicate with the companion SoC via the FLC ring bus and the first hopping bus.

The second hopping bus provides connections via a ring bus stop and second hopping bus stops between (i) the FLC ring bus and (ii) interfaces in the mobile SoC. The interfaces in the mobile SoC may include an Ethernet interface, one or more PCIe interfaces, and a hybrid (or combination) interface. The Ethernet interface may be a 10 GE interface and is connected to an Ethernet network via a port. The one or more PCIe interfaces may include as examples a third generation PCIe interface PCIe3 and a mini PCIe interface (mPCIe). The PCIe interfaces may be connected to solid-state drives. The hybrid interface may be SATA and PCIe compatible to transfer data according to SATA and/or PCIe protocols to and from SATA compatible devices and/or PCIe compatible devices. As an example, the PCIe interface may be connected to a storage drive via a port. The storage drive may be a solid-state drive or a hybrid drive. The interfaces have respective ports for connection to devices external to the mobile SoC.

The companion SoC may include a control module. The control module may access and/or control access to the VPM and the interfaces via the hopping bus stops. In one embodiment, the control module is not included. The control module may be connected to and in communication with the hopping bus stops, the VPM 1198, and/or the interfaces.

The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

Although the terms first, second, third, etc. may be used herein to describe various chips, modules, signals, elements, and/or components, these items should not be limited by these terms. These terms may be only used to distinguish one item from another item. Terms such as "first," "second," and other numerical terms when used herein do not imply a sequence or order unless clearly indicated by the context. Thus, a first item discussed below could be termed a second item without departing from the teachings of the example examples.

Also, various terms are used to describe the physical relationship between components. When a first element is referred to as being "connected to", "engaged to", or "coupled to" a second element, the first element may be directly connected, engaged, disposed, applied, or coupled to the second element, or intervening elements may be present. In contrast, when an element is referred to as being "directly connected to", "directly engaged to", or "directly coupled to" another element, there may be no intervening elements present. Stating that a first element is "connected to", "engaged to", or "coupled to" a second element implies that the first element may be "directly connected to", "directly engaged to", or "directly coupled to" the second element. Other words used to describe the relationship between elements should be interpreted in a like fashion (e.g., "between" versus "directly between", "adjacent" versus "directly adjacent", etc.).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' and the term 'controller' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

A module or a controller may include one or more interface circuits. In some examples, the interface circuits may include wired or wireless interfaces that are connected to a local area network (LAN), the Internet, a wide area network (WAN), or combinations thereof. The functionality of any given module or controller of the present disclosure may be distributed among multiple modules and/or controllers that are connected via interface circuits. For example, multiple modules and/or controllers may allow load balancing. In a further example, a server (also known as remote, or cloud) module or (remote, or cloud) controller may accomplish some functionality on behalf of a client module and/or a client controller.

The term code, as used above, may include software, firmware, and/or microcode, and may refer to programs, routines, functions, classes, data structures, and/or objects. The term shared processor circuit encompasses a single processor circuit that executes some or all code from multiple modules and/or controllers. The term group processor circuit encompasses a processor circuit that, in combination with additional processor circuits, executes some or all code from one or more modules and/or controllers. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules and/or controllers. The term group memory circuit encompasses a memory circuit that, in combination with additional memories, stores some or all code from one or more modules and/or controllers.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Nonlimiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A data access system comprising:
a storage device configured to store data; and
a processor including one or more levels of cache, wherein in response to data required by the processor not being cached within the one or more levels of cache, the processor is configured to generate a physical address to be accessed within the storage device in order to retrieve the data required by the processor,
wherein the storage device includes
  (i) a main memory, and
  (ii) a cache module configured as a final level of cache to be accessed by the processor prior to the processor accessing the main memory, wherein the cache module includes
    a first controller configured to, in response to the data required by the processor not being cached within the one or more levels of cache of the processor, convert the physical address to be accessed within the storage device into a virtual address within the final level of cache,
wherein the final level of cache is configured to use the virtual address within the final level of cache to determine whether the data required by the processor is cached within the final level of cache, and
wherein, in response to the data required by the processor not being cached within the final level of cache, one or more of the cache module or the processor is configured to retrieve the data required by the processor from the main memory.

2. The data access system of claim 1, wherein:
the cache includes dynamic random access memory;
the cache module further comprises a second controller; and
the second controller is configured to (i) convert the virtual address within the final level of cache into a physical address within the dynamic random access memory, and (ii) determine whether the data required by the processor is cached within the dynamic random access memory based on the physical address within the dynamic random access memory,
wherein in response to the data required by the processor being cached within the dynamic random access memory, the data required by the processor is determined to be cached within the final level of cache.

3. The data access system of claim 2, wherein:
the second controller is configured to, in response to the data required by the processor being cached in the dynamic random access memory, access a location in the dynamic random access memory corresponding to the physical address within the dynamic random access memory; and
the first controller is configured to, in response to the data required by the processor not being cached in the dynamic random access memory, access a location in the main memory corresponding to the physical address within the dynamic random access memory.

4. The data access system of claim 2, wherein the cache module is configured to access a second dynamic random access memory, and wherein the second controller is configured to:
convert the virtual address within the final level of cache into a physical address within the second dynamic random access memory; and
determine whether the data required by the processor is cached within the second dynamic random access memory based on the physical address within the second dynamic random access memory.

5. The data access system of claim 4, wherein the second dynamic random access memory is located in a different system-on-chip (SOC) than the cache module.

6. The data access system of claim 1, wherein the first controller is configured to perform a full set associative translation of the physical address to be accessed by the storage device to generate the virtual address.

7. The data access system of claim 1, wherein the first controller is configured to:
without receiving a request for upcoming data from the processor, (i) predict that the processor is to request access to the upcoming data, (ii) access the upcoming data in the main memory, (iii) store the upcoming data in the cache of the cache module; and
subsequent to storing the upcoming data in the cache of the cache module, (i) receive a request for the upcoming data from the processor, and (ii) transfer the upcoming data from the cache of the cache module to the processor.

8. The data access system of claim 1, wherein the main memory comprises a solid-state drive (SSD), and wherein the final level of cache comprises a dynamic random access memory (DRAM).

9. A network device comprising the data access system of claim 1.

10. The network device of claim 9, wherein the network device comprises at least one of a mobile phone, a tablet, or a computer.

11. The network device of claim 10, further comprising a system bus connected between (i) the processor and (ii) the cache module and the main memory,
wherein the data is transferred (i) between the processor and the cache module via the system bus, and (ii) between the cache module and the main memory via the system bus.

12. A method of operating a data access system, wherein the data access system comprises (i) a processor having one or more levels of cache, and (ii) a storage system comprising a cache module and a main memory, wherein the cache module comprises a cache and a first controller, wherein the cache of the cache module is configured as a final level of cache to be accessed by the cache module prior to the cache module accessing the main memory, the method comprising:
determining whether data required by the processor is cached within the one or more levels of cache of the processor;
if the data required by the processor is not cached within the one or more levels of cache of the processor, (i) generating a physical address, via the processor, to be accessed within the storage system in order to retrieve the data required by the processor; and
at the first controller and in response to the data required by the processor not being cached within the one or more levels of cache of the processor, converting the physical address to be accessed within the storage system into a virtual address within the final level of cache to determine whether the data required by the processor is cached within the final level of cache,
wherein, in response to the data required by the processor not being cached within the final level of cache, retrieving the data required by the processor from the main memory.

13. The method of claim 12, further comprising, at a second controller in the cache module:
converting the virtual address within the final level of cache into a physical address within a dynamic random access memory, wherein the cache includes the dynamic random access memory;
determining whether the data required by the processor is cached within the dynamic random access memory based on the physical address within the dynamic random access memory; and
in response to the data required by the processor being cached within the dynamic random access memory, determining the data required by the processor to be cached within the final level of cache.

14. The method of claim 13, further comprising:
at the second controller and in response to the data required by the processor being cached in the dynamic random access memory, accessing a location in the dynamic random access memory corresponding to the physical address within the dynamic random access memory; and
at the first controller and in response to the data required by the processor not being cached in the dynamic random access memory, accessing a location in the main memory corresponding to the physical address within the dynamic random access memory.

15. The method of claim 12, further comprising at the first controller performing a full set associative translation of the physical address to be accessed by the storage system to generate the virtual address.

16. The method of claim 12, further comprising at the first controller:
without receiving a request for upcoming data from the processor, (i) predicting that the processor is to request access to the upcoming data, (ii) accessing the upcoming data in the main memory, (iii) storing the upcoming data in the cache of the cache module; and
subsequent to storing the upcoming data in the cache of the cache module, (i) receiving a request from the processor for the upcoming data, and (ii) transferring the upcoming data from the cache of the cache module to the processor.

* * * * *